United States Patent [19]

Irvin et al.

[11] Patent Number: 5,121,396
[45] Date of Patent: Jun. 9, 1992

[54] PRESERVATION OF CRC INTEGRITY UPON INTENTIONAL DATA ALTERATION DURING MESSAGE TRANSMISSION

[75] Inventors: David R. Irvin, Raleigh; Kian-Bon Sy, Cary, both of N.C.

[73] Assignee: International Business Machines Corp., Armonk, N.Y.

[21] Appl. No.: 263,310

[22] Filed: Oct. 27, 1988

[51] Int. Cl.⁵ .......................................... H03M 13/00
[52] U.S. Cl. ................................. 371/53; 371/20.2; 371/3.71
[58] Field of Search ............ 370/94, 99, 85.13, 85.14; 371/37.1, 53, 20.2

[56] References Cited

U.S. PATENT DOCUMENTS 4,723,244 2/1988 Iacoponi .......................... 371/37.1

Primary Examiner—Stephen M. Baker
Attorney, Agent, or Firm—Gerald R. Woods

[57] ABSTRACT

In complex networks, data frames may be routed through different systems having different frame or addressing requirements. When the frames are transferred or bridged between such systems, known changes may have to be made in the frame contents to accommodate these requirements. To maintain the integrity of error checking provided by Cyclical Redundancy Checking (CRC) techniques, a system receiving a frame uses an improved Frame Check Sequence value modification technique which modifies a Frame Check Sequence (FCS) field value only as a function of the known or planned changes to be made in the frame. If unplanned changes (that is, errors) are introduced at the receiving system, application of standard CRC error checking techniques at the next system to receive the frame will indicate those errors.

5 Claims, 4 Drawing Sheets

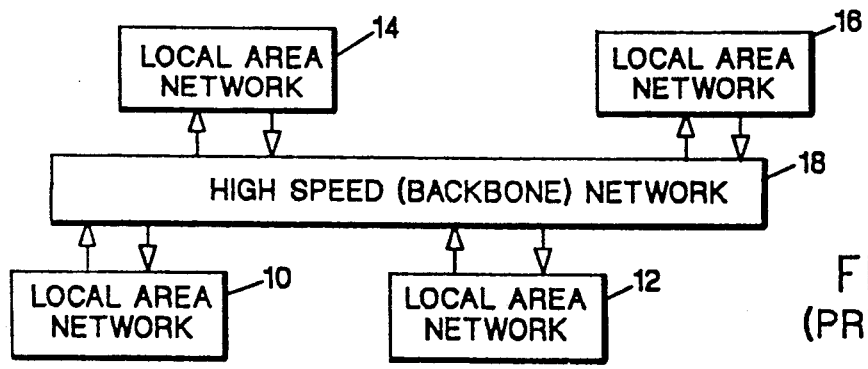
FIG. 1 (PRIOR ART)
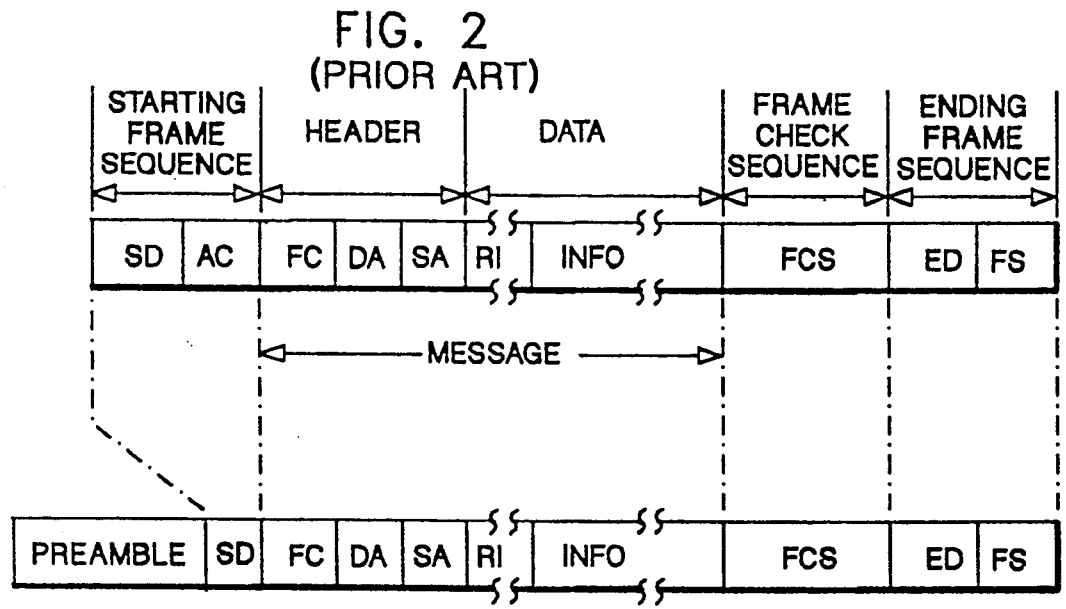
FIG. 2 (PRIOR ART)
FIG. 3 (PRIOR ART)
FIG. 4 (PRIOR ART)
SD - STARTING DELIMITER
AC - ACCESS CONTROL
FC - FRAME CONTROL
DA - DESTINATION ADDRESS
SA - SOURCE ADDRESS
RI - ROUTING INFORMATION (VARIABLE LENGTH)
INFO - INFORMATION (VARIABLE LENGTH)
FCS - FRAME CHECK SEQUENCE
ED - ENDING DELIMITER
FS - FRAME STATUS

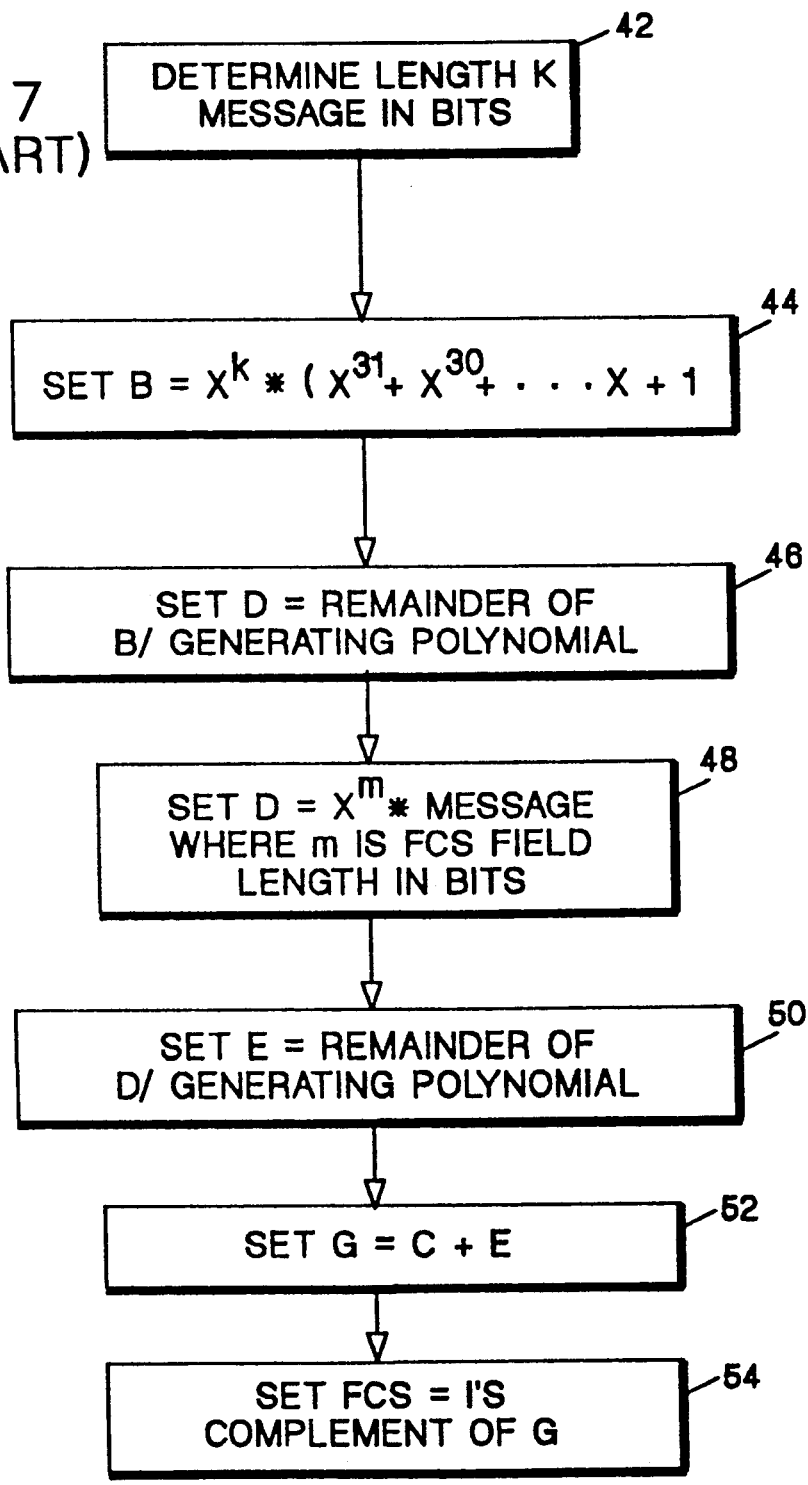

PRESERVATION OF CRC INTEGRITY UPON INTENTIONAL DATA ALTERATION DURING MESSAGE TRANSMISSION

FIELD OF THE INVENTION

The present invention relates to data communications systems and more particularly to a method of maintaining the integrity of cyclical redundancy checking (CRC) error protection where data is intentionally changed at one or more intermediate points on the data path between a source and a destination.

BACKGROUND OF THE INVENTION

A data communications network can be thought of as a collection of separate data processing systems which may be connected to form a data path between a first end user at one system and a second end user at another system.

Data to be transmitted through a network is almost always organized in discrete units called frames. A frame normally has recognizable bit patterns at the beginning and end. These bit patterns, commonly called delimiters, are used by a receiving system to identify the start and the end of each frame. A typical frame also has a header which includes the address of the system to which the data is to be sent (the destination system) and the address of the system from which the data is sent (the source system). The frame can also include routing information for setting up paths through the network between the source and destination systems.

To enable a destination system to determine whether errors have been introduced into the data during transmission through the network, each frame may include a frame check sequence or FCS field. The original value of the FCS field is established at the source system by applying a predetermined mathematical algorithm to selected fields in the frame. The results of the algorithm are written into the FCS field. When the frame arrives at the destination system, that system applies the same algorithm to the same fields and compares the results with the value of the FCS field contained in the received frame. If the FCS value generated by the destination system and the FCS field value in the received frame are the same, it is assumed the data has been received without error.

In a complex network, different systems may use different formats for a data frame. When data is transferred into a system having a different frame format, the contents of the fields used in calculation of the original FCS field value may intentionally be changed by the receiving system.

Although the actual data within the frame may not change during frame format conversion operations, any system which subsequently receives a converted frame will be unable to perform normal error checking using the frame FCS field value as described above. This is because the system receiving the converted frame will generate its own FCS field value using the same algorithm and the same fields as were used by the source system in establishing an original FCS field value. If the contents of those fields have been changed (even intentionally) at some point along the data path, the receiving system can be expected to generate an FCS field value different from the original FCS field value calculated by the source system. The mismatch between calculated and received FCS field values would falsely indicate an error in the actual data in the received frame.

It has been suggested that this problem can be avoided by having each intermediate system on a data path recalculate the FCS field value once the format changes have been made. The recalculated FCS field value would be inserted in the frame before the frame is passed on to the next system.

Although this approach permits a greater degree of error checking than the approach originally described, it still has inadequacies. In implementing the "FCS recalculation" approach, each receiving system necessarily performs at least three sequential operations involving a data frame. First, the receiving system checks the incoming data frame for errors by calculating its own FCS field value and comparing it to the FCS field value in the received frame. Second, the receiving system changes certain fields in the frame to convert the frame to the new format. Third, the receiving system recalculates the FCS field value based upon the changed frame.

This sequential three step process leaves the data unprotected against errors introduced after the first step is completed but before the third step is performed. If an error is introduced into the data during this time period, the FCS field value calculated during the third step will not in any way reflect or indicate that error since the presumption is that FCS field value calculations are being performed on error-free data. Assuming no further errors are introduced, error checking operations performed at subsequent receiving systems will falsely indicate that the data contained in the frame is free of errors.

It has also been suggested that each frame being transferred into a system using a different frame format be encapsulated or enveloped within the frame structure appropriate for the receiving system. An FCS field value would be generated for the encapsulating frame. One drawback to this approach is that the encapsulation is necessary only if the data originates in a system having a different frame format. The receiving system must be able to treat incoming frames differently, depending on where these frames come from. This requirement adds to the complexity of the data transmission.

SUMMARY OF THE INVENTION

The present invention is a method of establishing an FCS field value in a data frame which permits detection of errors introduced into the data at intermediate systems. The method preserves the error checking value of the FCS field while avoiding the complexity of the encapsulating technique mentioned above.

According to the present method, an FCS field value is calculated at a source system or station for the data by applying a predetermined cyclical redundancy checking algorithm to selected fields in each frame. At each intermediate station on a path between the source station and the destination station, the field value is modified to reflect planned or intentional changes to be made by that station in selected fields of the frame. If unintended changes (that is, errors) are introduced into the selected fields, those changes are not reflected in the modified FCS field value since the modification is based solely on intended or planned changes in the data. Therefore, when the next station on the path checks the integrity of the frame by calculating its own FCS field value based on selected fields in the frame and comparing its FCS value to the received FCS value, the difference in the two values will indicate the presence of an error or errors in the data.

BRIEF DESCRIPTION OF THE DRAWINGS

While the technical description concludes with claims particularly pointing out and distinctly claiming that which is regarded as the present invention, details of a preferred embodiment of the invention may be more readily ascertained from the following technical description when read in conjunction with the accompanying drawings wherein:

FIG. 1 is a simple block diagram of a data communications network employing systems which may have different frame formats;

FIG. 2 depicts the frame format employed in one known type of local area network;

FIG. 3 depicts the frame format employed in a high speed network employing optical fibers;

FIG. 4 is a table of terms corresponding to the abbreviations employed in FIGS. 2 and 3;

FIG. 7 is a flow chart setting forth in some detail conventional steps performed in calculating FCS or frame check sequence values.

TECHNICAL DESCRIPTION

Figure 5:
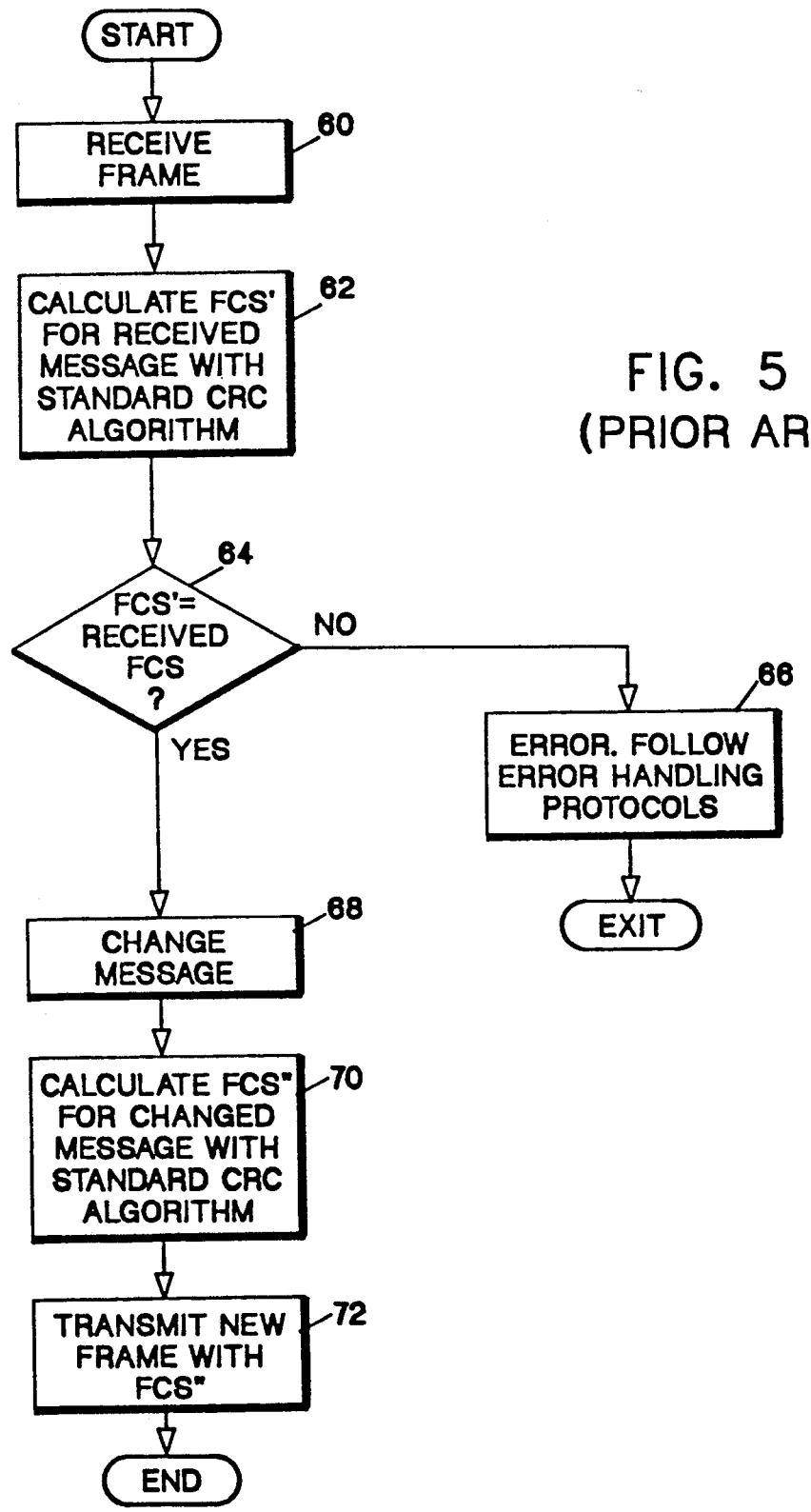
FIG. 5 is a flow chart of a known prior art process for producing FCS field values when intentional changes are to be made in a data frame.

FIG. 1 discloses a data communications network consisting of a number of local area networks 10, 12, 14 and 16 which may be interconnected through an intermediate higher speed or backbone network 18. It should be noted that the term network is used both to refer to the individual local area networks, backbone network and the overall combination of these individual networks; i.e., the data communications networks. Which network is being referred to will be clear from the context in which the word is used.

There are different kinds of local area networks. For purposes of illustration, it will be assumed that the local area networks 10, 12, 14 and 16 are token-ring networks of a particular type. In this type of token-ring network, devices such as terminals, peripherals, cluster controllers and computers are connected to a single continuous ring or shared data transmission media. Different types of media, such as cable or twisted-pair copper wire, may be used for the ring. Optical fibers may also be used as ring media where high bandwidth or substantial immunity against electromagnetic interference or signal attenuation is required.

In a specific type of token-ring network, a circulating electronic token passes sequentially from one node or device to the next around the ring, allowing each node an opportunity to transmit data. A node having data to transmit can "capture" the token and "expand" that token into a frame which is circulated around the ring. Each node receives the frame but only the node or nodes to which it is addressed make use of the frame data. When the frame returns to the original source node, that node must remove the frame from the ring and issue a token to allow other nodes in the ring the opportunity to transmit.

A limited number of devices or nodes can be supported on a single local area network of this type. To expand the number of supported devices or nodes, individual local area networks can be interconnected through the high speed backbone network 18. The physical and logical connections between two networks are referred to as the bridge between the two networks.

One example of a high speed or backbone network is an FDDI (Fiber Distributed Data Interface) network which uses optical fibers as a transmission medium and which supports data rates several times greater than the data rates that are employed in other typical local area networks. An FDDI network can also be characterized as a token-passing network. One of the significant differences between an FDDI network and the token-ring network described above is that an FDDI station or node originating a frame sends out a token at the end of that frame. That is, the originating node does not wait for the frame to return before issuing the token. FDDI networks are described in draft standards issued by an ANSI (American National Standards Institute) X3T9.5 committee. The details of the standard are not, however, critical to an understanding of the present invention. In fact, the present invention is not limited to particular kinds of networks.

Token ring local area networks and FDDI networks employ different frame formats. FIG. 2 depicts a frame format employed in a token-ring network complying with current requirements set forth by Committee 802.5 of the IEEE (Institute of Electrical & Electronics Engineers) organization. The frame consists of a number of fields which can be classified as starting frame sequence fields, header fields, data fields, a frame check sequence or FCS field and ending frame sequence fields. The starting frame sequence fields include an 8-bit SD or starting delimiter field, which is a recognizable bit pattern identifying the start of the data frame. The AC or access control field is also an 8-bit field having several distinct subfields used for different functions. The subfields establish the priority of a token, distinguish between a frame and a token (which is actually an abbreviated frame), control whether certain tokens or frames remain on the ring and set the priority to be accorded the next token to be issued.

The header fields include an 8-bit FC or frame control field which designates a frame either as a MAC (Medium Access Control) or a LLC (Logical Link Control) frame. MAC frames are used for control purposes while LLC frames transport user data. The header also has a 48-bit DA or destination address field containing the address of the user to which the data is to be sent and a 48-bit SA or source address field containing the address of the source user. The starting frame sequence fields and header fields of the frame are sometimes collectively referred to as a physical header.

The frame also includes data fields, including an RI or routing information field containing data used to establish a path through the network. The RI or routing information is one of two variable length fields in the frame. The other variable length field is the INFO field, which contains the actual data being transmitted from a source to a destination. The data fields are followed by a 32-bit frame check sequence or FCS field which is used for error checking purposes. The manner in which the FCS field value is calculated is discussed in greater detail below. It should be noted, however, that the FCS field value is determined by the data contained in the message (header and data) portion of the frame. Each frame ends with ending frame sequence fields consisting of an 8-bit ending delimiter and an 8-bit frame status field. The ending delimiter is, of course, recognized by the receiving system as an end-of-frame indicator. Different bits in the frame status field serve different functions. One bit, initially set to 0 by the originating node is set to 1 by any intermediate node which detects an error, other bits, also originally 0's, are set to 1 by any station which recognizes its own address and which copies the frame into its receive buffer.

The frame format employed in an FDDI network meeting ANSI X3T9.5 standards is similar in many respects to the token-ring frame format. Referring to FIG. 3, an FDDI frame includes a starting delimiter, a message, a frame check sequence and an ending frame sequence. Unlike a token-ring frame, however, an FDDI frame is preceded by a variable length preamble at least 64 bits long. Also, while the FDDI header includes a frame control field along with destination and source address fields, the frame control field for the FDDI frame has a different structure than the frame control field for a token-ring frame notwithstanding each field is 8 bits long. As noted above, the first two bits of a token-ring frame control field identify the frame as a LLC or MAC frame. Bits 3-5 of a token-ring frame control field are reserved (and thus are always set to zeros) while bits 6-8 are indicative of the priority to be given the frame at its destination. In an FDDI system, the first bit of the frame control field establishes whether the FDDI frame is an asynchronous frame. The second bit establishes whether the FDDI frame includes a 48-bit address or not. Bits 3-4 serve the same function as bits 1-2 of the token-ring frame control field in identifying whether the frame is an LLC or a MAC frame. In the FDDI frame control field, bit 5 is reserved while bits 6-8 establish the destination system priority level.

Because an LLC or MAC frame is identified by different bits in frame control fields used for token-ring and FDDI frames, respectively, the content of the frame control field is necessarily different depending whether the frame is being routed through a token-ring network or an FDDI network. Because the frame control field is part of the message on which FCS field values are based, the differences in the frame control field must be reflected in any error checking process.

FIG. 5 is a flow chart of one type of prior art process used to alter the FCS field when planned or intentional changes are made to the frame message during bridging from one type of network to another.

After the frame is received (operation 60) in the network, standard error checking operations are performed. These operations, identified as block 62, require that the receiving system calculate an FCS field value FCS' by applying a standard cyclical redundancy checking or CRC algorithm to the message portion of the received frame. The receiving system must determine (operation 64) whether a computed value FCS' is consistent with the FCS field value found in the received frame. A lack of consistency between the calculated value FCS' and the received value FCS indicates an error in the received message. Normal error handling protocols are followed (block 66) when an error is detected. If operation 64 indicated that FCS' was consistent with the received FCS field value, however, the receiving station would then process the received frame by changing the message (operation 68). The changes in the message may involve nothing more than substituting the frame control field required by the receiving system for the frame control field in the received frame. The receiving system would then calculate (operation 70) a new FCS field value FCS" by applying the standard CRC algorithm to the changed message. The frame could then be transmitted through the receiving system (operation 72) with the newly calculated FCS field value FCS".

As noted earlier, there is a time interval during the processing of the frame in which the message contents are effectively unprotected. That time interval occurs between the completion of operation 64 and the calculation of FCS" in operation 70. If errors are introduced into the message during this time interval, FCS" is calculated using the erroneous message. The next system to receive the frame will not, however, be able to detect the error since both the FCS field calculated at the next system and the FCS field in the frame received at that system will be based on the same erroneous message.

Figure 6:
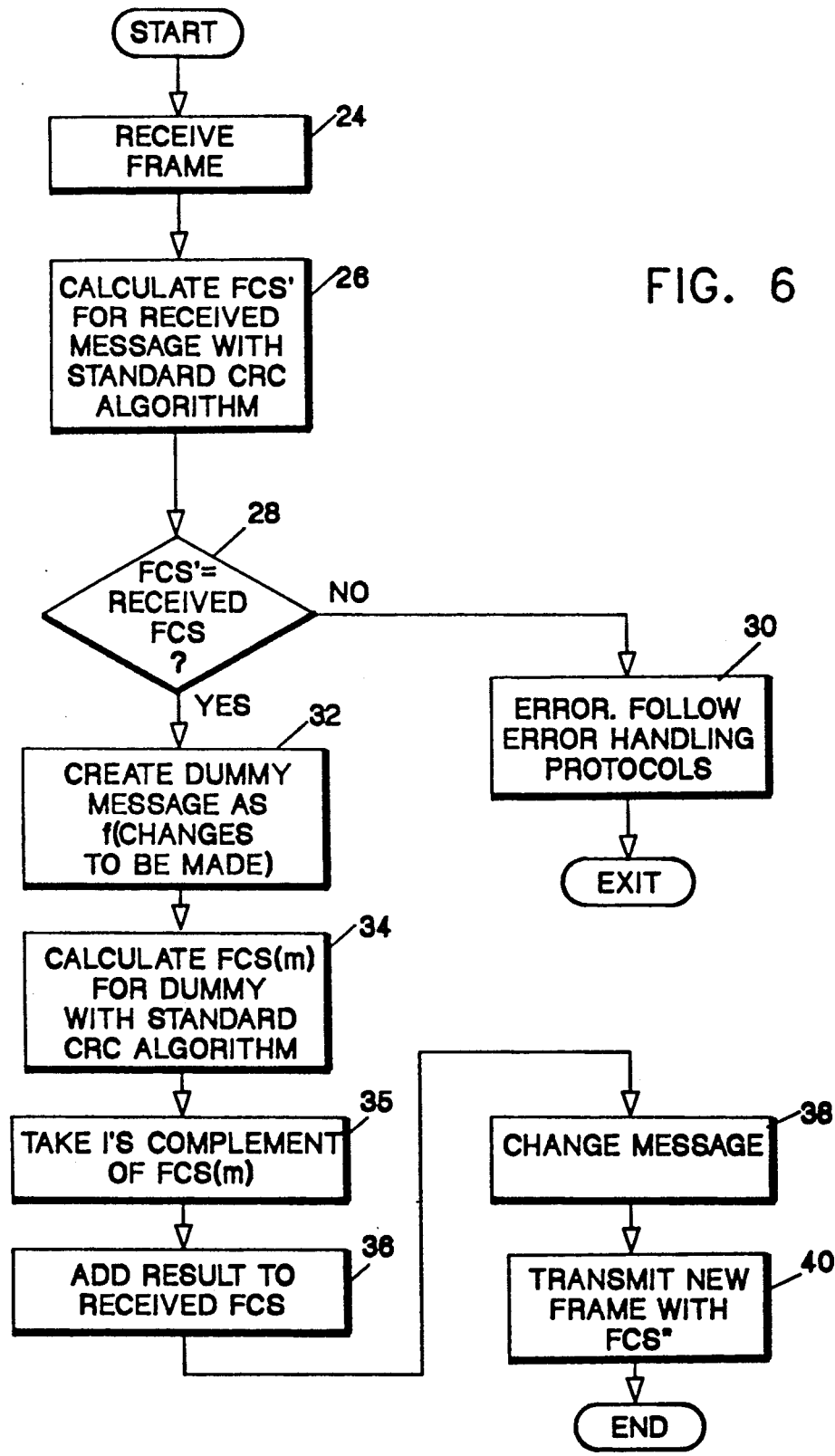
FIG. 6 is a flow chart of a preferred embodiment of the present invention.

To eliminate the periods of time during which data is unprotected, the process illustrated in FIG. 6 can be employed. Certain steps in the process to be described are identical to corresponding steps in the prior art process. For example, the system must obviously receive a frame (operation 24) before any further processing can take place. The system will preferably also check for errors in the incoming frame by applying the standard CRC algorithm to the message portion of the frame to derive a calculated FCS field value FCS' (operation 26). The system will also check for consistency between the calculated FCS field value and the received FCS field value in operation 28 to invoke error handling protocols (operation 30) if an inconsistency is detected. At this point, the present method becomes quite different from the prior art method.

The present method does not totally recalculate the frame check sequence field value but instead modifies the existing FCS value as a function of the planned or intentional message changes. To accomplish this, the receiving system creates a "dummy" message in an operation 32. This dummy message contains the same number of bits as the message portion of the frame (the header fields plus the data fields) but represents only the planned changes to be made in the received message. In most instances, one or two bits in the frame control field may be changed in the message when a frame is bridged from a token-ring network to a FDDI network or vice versa. Specifically, a frame control field for an LLC token-ring frame, which is the only type of frame that is commonly bridged to another network, will take the form FC=01000YYY where YYY represents the frame priority. A frame control field for the same LLC frame in an FDDI network will take the form FC=01010YYY. Since the priority of the frame does not change during bridging, it can be seen that only one bit in the frame control field must necessarily be changed when the frame is transferred from a token-ring to an FDDI network. Specifically, the fourth bit in the frame control field must be changed from 0 to 1. If the frame is being transferred from the FDDI network to a token-ring network, the same bit must be set from 1 to 0.

The binary form of the "dummy" message can be established through simple binary or modulo-2 arithmetic. To provide a specific example, if a frame being transferred from a token-ring network to an FDDI network had a message area (header plus data) 256 bits long, in a simple case, the only difference between the message in the token-ring and the FDDI networks would be in fourth bit of the frame control field. The fourth bit would be converted from a 0 in the token-ring frame to a 1 in the FDDI frame. For this type of frame conversion, the dummy message would also be 256 bits long. In the final form of a message to be transferred in an FDDI network, the fourth bit of the frame control field would be a 1. In a token-ring network, the same bit would be a zero. Because of the specific operations performed by the standard CRC algorithm, this single bit change can only be accomplished by creating a dummy message in which the first thirty-two bits are the 1's complement of the actual modulo 2 difference between the FDDI frame and the corresponding token-ring frame. That is, bits 1-3 and 5-32 are set to 1 in the dummy while bit 4 is set to zero. Assuming no changes are to be made in the message except in the frame control field, the remaining bits of the dummy message would be set to 0.

In accordance with the present invention, an FCS field modifier is calculated in an operation 34 by applying the standard CRC algorithm (operation 34) to the 256 bit dummy message and (to comply with IEEE standards) by taking the 1's complement (operation 35) of the result. The result of operation 35 is an FCS(m) value. In an operation 36, a modified FCS value FCS" is then calculated by adding FCS(m) to the FCS value in the received frame, using modulo 2 arithmetic operations.

While use of a standard CRC algorithm is envisioned, non-standard algorithms can be employed provided any algorithm used is a linear mathematical algorithm. A linear mathematical algorithm is one that satisfies the equation $f(A+B)=f(A)+f(B)$ where f is indicative of a mathematical function while A and B are data.

When the modified FCS field value FCS" has been calculated and the message has been changed (operation 38) as planned, the converted frame can be transmitted (operation 40) to the next system on the data path. Since the FCS field value is modified during conversion only as a function of planned changes, any errors introduced into the message are not factored into the modified FCS value. When the frame is received at the next system on the data path, the standard CRC error checking operation should reveal an inconsistency between the FCS field value calculated at that system and the modified FCS value received with the frame.

A standard or conventional CRC algorithm is briefly described with reference to FIG. 7. The number of bits in the message portion of the frame (the header plus data) must be determined in an operation 42 in order to calculate an FCS field value. A Variable B is then set equal to the product of $X^k$ and a polynomial $X^{31}+X^{30}+X^{29}+ \ldots +X+1$ where the number of terms in the polynomial is equal to the number of bits in the FCS field. A second variable C is calculated (operation 46) as the remainder resulting from modulo 2 division of variable B by a standard Generating Polynomial.

According to existing IEEE standards, the Generating Polynomial takes the form $X^{32}+x^{26}+X^{23}+X^{22}+X^{16}+X^{12}+X^{11}+X^{10}+X^8+X^7+X^5+X^4+X^2+X+1$. A fourth variable D is computed in operation 48 as the product of $X^m$ and the binary representation of the frame message treated as a polynomial where m is the length of the frame check sequence field in bits. A variable E is calculated in operation 50 as the remainder resulting from a modulo 2 division of variable D by the Generating Polynomial described above. A variable G is set equal to the modulo 2 sum of the computed variables C and E in operation 52 and the frame check sequence field value is set to the 1's complement of the variable G in an operation 54.

The process described above is used on the orginal data message at the source station. At each intermediate station at which the message is to be changed, normally by changing the frame control field, the FIG. 7 process is applied only to the dummy message representing the planned changes to be made in the message.

The preceding discussion has assumed that the invention may be used beneficially in situations where a receiving system performs frame format conversions. The invention may also be used in any other situation in which planned changes are to be made in a frame at a receiving station. For example, in a so-called frame relay system, each system receiving a frame may strip its own address from one of the fields of the frame and may substitute the address of the next system which is to receive the frame. The changes in the address field are known, of course, to the system doing the address conversion. The present invention may be used to maintain continuous CRC error protection in such a frame relay system.

While there has been described what is considered to be a preferred embodiment of the invention, variations and modifications in that embodiment will occur to those skilled in the art once they become aware of the basic concepts of the invention. Therefore, it is intended that the appended claims shall be construed to include not only the preferred embodiment but all such variations and modifications as fall within the true spirit and scope of the invention.

We claim:

1. A method of maintaining the integrity of data contained in data frames being routed along a path through a data communications system, said method comprising the steps of:
   calculating a frame check sequence value for each frame at the originating station as a function of the value of selected fields in the frame; and
   modifying the frame check sequence value at each intermediate station on the path as a function of the intended changes to be made at that station in those selected fields said modifying step being performed independently of actual changes made in the selected fields at the intermediate station.

2. A method of maintaining integrity of data contained in data frames being routed along a path through a data communications system, said method comprising the steps of:
   applying a predetermined algorithm to each frame at the originating station to calculate a frame check sequence value; and
   modifying the frame check sequence value at each intermediate station on the path by
      applying the same algorithm to planned changes in the selected fields at the intermediate station to derive a frame check sequence modifier independent of actual changes made in the selected fields at the intermediate station, and
      modifying the frame check sequence value contained in the frame received at the intermediate station as a function of the value of said modifier.

3. For use in a multi-station data communications system in which (1) data frames are transferred from a source station to a destination station through one or more intermediate stations, (2) predetermined changes may be made in each data frame at an intermediate station and (3) each data frame includes a frame check sequence value which can be used by a receiving station to check the integrity of the data, a method for establishing a frame check sequence value at each intermediate station that will permit the next station to detect data errors introduced at the intermediate station, said method comprising the steps of:

establishing a dummy field representing changes to be made in selected fields in the received frame before the frame is transferred to the next station;

calculating a frame check sequence value modifier independent of actual changes made in the selected fields at the intermediate station by applying the same algorithm to the dummy field that was applied to the selected fields in the original data at the source station to calculate the original frame check sequence value;

altering the frame check sequence value in the received data frame as a function of the calculated modifier; and using the altered frame check sequence value in the frame to be transmitted to the next station.

4. In a data communications system in which data frames are routed from source stations to destination stations through intermediate stations, a method of maintaining the integrity of each data frame even though the frame contents are intentionally changed at one or more of the intermediate stations, said method comprising the steps of:

at the source station,
calculating a frame check variable by performing linear mathematical operations on selected fields in the frame using a predetermined algorithm;
transmitting the frame, including the calculated variable, toward the destination station along a selected route;

at each intermediate station on the route,
receiving the frame,
comparing the received variable with a variable calculated by applying the predetermined algorithm to the selected fields in the received frame,
where the received variable is not equal to the calculated variable, generating an error signal,
where the received variable is equal to the calculated variable, calculating a variable modifier by applying said predetermined algorithm to dummy fields representing the changes to be made in the selected fields,
modifying the received variable as a function of the variable modifier to establish a modified variable,
changing the selected fields in the frame, and
transmitting the changed frame with the modified variable to the next station; and at the destination station,
comparing the received variable with a variable calculated by applying the predetermined algorithm to the selected fields in the received frame, and
generating a frame error signal only where the calculated variable is not equal to the received variable.

5. For use in a multi-station data communications system in which (1) data frames are transferred from a source station to a destination station through one or more intermediate stations, (2) predetermined changes may be made in each data frame at an intermediate station and (3) each data frame includes a frame check sequence value which can be used by a receiving station to check the integrity of the data, a method for establishing a frame check sequence value at each intermediate station that will permit the next station to detect data errors introduced at the intermediate station, said method comprising the steps of:

establishing a dummy field representing changes to be made in selected fields in the received frame before the frame is transferred to the next station;

calculating a frame check sequence value modifier by applying the same algorithm to the dummy field that was applied to the selected fields in the original data at the source station to calculate the original frame check sequence value, said calculating step further comprising the steps of:

determining the number of bits k in the selected fields;

calculating a first variable equal to the product of $x^k$ and $(x^{m-1}+x^{m-2}+x^{m-3}+ \ldots x+1)$ where m is the number of bits in the frame check sequence value;

calculating a second variable equal to the remainder resulting from division of the first variable by a predetermined polynomial;

setting a third variable equal to the product of $x^m$ and the value of the selected fields expressed as a polynomial;

calculating a fourth variable equal to the remainder resulting from division of the third variable by the predetermined polynomial; and summing the second and fourth variables;

taking the 1's complement of results of said summing step; and taking the 1's complement of the results of the immediately preceding step;

altering the frame check sequence value in the received data frame as a function of the calculated modifier; and using the altered frame check sequence value in the frame to be transmitted to the next station.

* * * * *